United States Patent
Wang

(10) Patent No.: US 9,984,750 B2
(45) Date of Patent: May 29, 2018

(54) NON-VOLATILE MEMORY DEVICE AND OPERATING METHOD THEREOF

(71) Applicant: Nuvoton Technology Corporation, Hsinchu (TW)

(72) Inventor: Cheng-Chih Wang, Hsinchu County (TW)

(73) Assignee: Nuvoton Technology Corporation, Hsinchu (TW)

( * ) Notice: Subject to any disclaimer, the term of this patent is extended or adjusted under 35 U.S.C. 154(b) by 1 day.

(21) Appl. No.: 15/414,643

(22) Filed: Jan. 25, 2017

(65) Prior Publication Data

US 2017/0229177 A1    Aug. 10, 2017

(30) Foreign Application Priority Data

Feb. 4, 2016   (TW) .............................. 105103646 A

(51) Int. Cl.
*G11C 13/00* (2006.01)
*G11C 14/00* (2006.01)

(52) U.S. Cl.
CPC ........ *G11C 13/0097* (2013.01); *G11C 13/004* (2013.01); *G11C 13/0069* (2013.01); *G11C 14/009* (2013.01); *G11C 2013/0073* (2013.01)

(58) Field of Classification Search
CPC ............ G11C 13/0097; G11C 13/0069; G11C 13/004; G11C 13/0038; G11C 2013/0045; G11C 14/009; G11C 2013/0073
See application file for complete search history.

(56) References Cited

U.S. PATENT DOCUMENTS

| | | |
|---|---|---|
| 8,604,827 B2 | 12/2013 | Jeong et al. |
| 2012/0212185 A1* | 8/2012 | Tanaka .................. H02J 7/0004 320/136 |
| 2016/0118821 A1* | 4/2016 | Takeda .................. H02J 7/0031 320/134 |
| 2017/0229182 A1* | 8/2017 | Lin ......................... G11C 16/10 |

* cited by examiner

*Primary Examiner* — Hien Nguyen
(74) *Attorney, Agent, or Firm* — JCIPRNET

(57) ABSTRACT

A non-volatile memory (NVM) device includes a logic memory circuit, a NVM element, a writing circuit and a reading circuit. The input terminal of the writing circuit and the output terminal of the reading circuit are coupled to the output terminal of the logic memory circuit. The first output terminal of the writing circuit and the first input terminal of the reading circuit are coupled to the first terminal of the NVM element. The second output terminal of the writing circuit and the second input terminal of the reading circuit are coupled to the second terminal of the NVM element. During a writing period, the writing circuit writes the stored data of the logic memory circuit into the NVM element. During a reading period, the reading circuit restores the data of the NVM element to the output terminal of the logic memory circuit.

16 Claims, 5 Drawing Sheets

NON-VOLATILE MEMORY DEVICE AND OPERATING METHOD THEREOF

CROSS-REFERENCE TO RELATED APPLICATION

This application claims the priority benefit of Taiwan application serial no. 105103646, filed on Feb. 4, 2016. The entirety of the above-mentioned patent application is hereby incorporated by reference herein and made a part of this specification.

BACKGROUND OF THE INVENTION

1. Field of the Invention

The present disclosure relates to a memory, and more particularly, to a non-volatile memory device and an operating method thereof.

2. Description of Related Art

When a traditional logic memory circuit with data storage functions (e.g., a latch, a flip-flop, a static random access memory (SRAM), etc.) enters a standby mode, the system needs to continuously supply power to the traditional logic memory circuit in order to keep the stored data. At the time, the traditional logic memory circuit may create a considerable amount of power consumption. If the logic memory circuit is simply replaced by a traditional non-volatile memory device, the purpose of zero power consumption may be accomplished since the power of the traditional non-volatile memory device may be completely turned off in the standby mode; however, the traditional non-volatile memory device is unable to achieve the same operating speed of the traditional logic memory circuit. What is need is to develop a memory circuit having the advantages of both the logic memory circuit and the non-volatile memory device may be integrated as one, so as to achieve the purpose of keeping high operating speed and reducing power consumption in the standby mode.

SUMMARY OF THE INVENTION

The present disclosure is directed to a non-volatile memory device and an operating method thereof, which integrate a logic memory circuit and a non-volatile memory element by utilizing a specific architecture. The non-volatile memory device has the access characteristic of the logic memory circuit during a normal operation period, and stored data of the logic memory circuit is backed up to the non-volatile memory device during a power-off period.

A non-volatile memory device is provided according to embodiments of the present disclosure. The non-volatile memory device includes a logic memory circuit, a non-volatile memory element, a writing circuit and a reading circuit. An input terminal of the writing circuit is coupled to an output terminal of the logic memory circuit to receive stored data of the logic memory circuit. A first output terminal of the writing circuit is coupled to a first terminal of the non-volatile memory element. A second output terminal of the writing circuit is coupled to a second terminal of the non-volatile memory element. During a writing period, the writing circuit writes the stored data of the logic memory circuit into the non-volatile memory element. A first input terminal of the reading circuit is coupled to the first terminal of the non-volatile memory element. A second input terminal of the reading circuit is coupled to the second terminal of the non-volatile memory element. An output terminal of the reading circuit is coupled to the output terminal of the logic memory circuit. During a reading period, the reading circuit restores the data of the non-volatile memory element to the logic memory circuit via the output terminal of the logic memory circuit.

An operating method of a non-volatile memory device is provided according to embodiments of the present disclosure. The operating method includes: configuring a logic memory circuit, a non-volatile memory element, a writing circuit and a reading circuit to the non-volatile memory device; writing stored data of the logic memory circuit into the non-volatile memory element by the writing circuit during a writing period; and restoring the data of the non-volatile memory element to the logic memory circuit via the output terminal of the logic memory circuit by the reading circuit during a reading period. Herein, an input terminal of the writing circuit is coupled to an output terminal of the logic memory circuit, a first output terminal of the writing circuit is coupled to a first terminal of the non-volatile memory element, a second output terminal of the writing circuit is coupled to a second terminal of the non-volatile memory element, a first input terminal of the reading circuit is coupled to the first terminal of the non-volatile memory element, a second input terminal of the reading circuit is coupled to the second terminal of the non-volatile memory element, and an output terminal of the reading circuit is coupled to the output terminal of the logic memory circuit.

Based on the above, the non-volatile memory device and the operating method thereof as described in the embodiments of the present disclosure integrate the logic memory circuit and the non-volatile memory element by utilizing the specific architecture. During the normal operation period, the writing circuit and the reading circuit are disabled. Therefore, the non-volatile memory element will not affect operation of the logic memory circuit during the normal operation period. During the writing period, the reading circuit is disabled and the writing circuit is enabled, so that the writing circuit writes (backs up) the stored data of the logic memory circuit into the non-volatile memory element. During the reading period, the writing circuit is disabled and the reading circuit is enabled, so that the reading circuit restores the data of the non-volatile memory element to the logic memory circuit.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
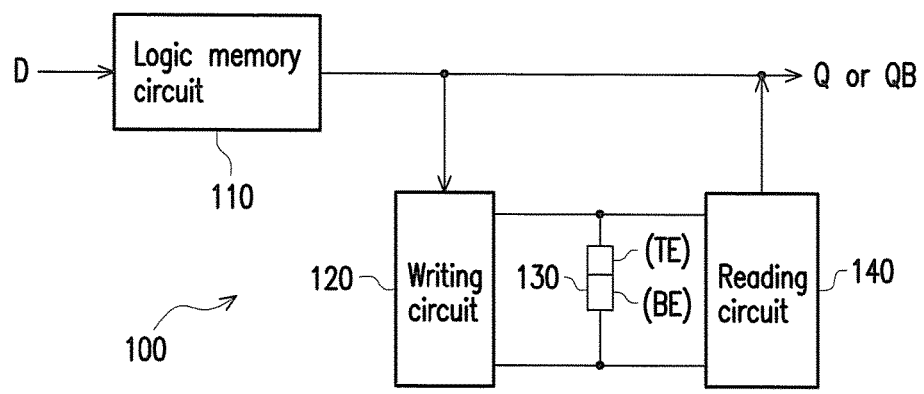
FIG. 1 is a block diagram illustrating circuitry of a non-volatile memory device according to an embodiment of the present disclosure.

Reference will now be made in detail to the present preferred embodiments of the present disclosure, examples of which are illustrated in the accompanying drawings. Wherever possible, the same reference numbers are used in the drawings and the description to refer to the same or like parts.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". Moreover, wherever appropriate in the drawings and embodiments, elements/components/steps with the same reference numerals represent the same or similar parts. Elements/components/steps with the same reference numerals or names in different embodiments may be cross-referenced.

FIG. 1 is a block diagram illustrating circuitry of a non-volatile memory device 100 according to an embodiment of the present disclosure. The non-volatile memory device 100 includes a logic memory circuit 110, a writing circuit 120, a non-volatile memory element 130 and a reading circuit 140. Based on design requirements, the logic memory circuit 110 may be any volatile memory elements/circuits. For example, the logic memory circuit 110 may include a latch, a flip-flop, a static random access memory, or other memory circuits/elements with data storage functions; however, the present disclosure is not limited thereto. In comparison with the non-volatile memory element 130, the logic memory circuit 110 has a faster access speed.

The logic memory circuit 110 has an input terminal (e.g., an input terminal D) and an output terminal (e.g., an output terminal Q or an output terminal QB). An input terminal of the writing circuit 120 is coupled to the output terminal (e.g., the output terminal Q or the output terminal QB) of the logic memory circuit 110 to receive stored data of the logic memory circuit 110 (that is, the data stored in the logic memory circuit 110). A first output terminal of the writing circuit 120 is coupled to a first terminal of the non-volatile memory element 130, and a second output terminal of the writing circuit 120 is coupled to a second terminal of the non-volatile memory element 130. The non-volatile memory element 130 may be a resistive memory, a phase change memory (PCM) or other non-volatile memories. For example, in the embodiment depicted in FIG. 1, the non-volatile memory element 130 includes a resistive memory element. Herein, a top electrode TE of the resistive memory element serves as the first terminal of the non-volatile memory element 130 to be coupled to the first output terminal of the writing circuit 120, and a bottom electrode BE of the resistive memory element serves as the second terminal of the non-volatile memory element 130 to be coupled to the second output terminal of the writing circuit 120. A first input terminal of the reading circuit 140 is coupled to the first terminal (e.g., the top electrode TE) of the non-volatile memory element 130. A second input terminal of the reading circuit 140 is coupled to the second terminal (e.g., the bottom electrode BE) of the non-volatile memory element 130. An output terminal of the reading circuit 140 is coupled to the output terminal (e.g., the output terminal Q or the output terminal QB) of the logic memory circuit 110.

The non-volatile memory element 130 may be implemented in any manner by those applying the present embodiment based on the design requirements. For example (but not limited thereto), a structure of the non-volatile memory element 130 may be formed by sequentially stacking "the bottom electrode BE, a variable resistor, the top electrode TE" on a substrate in a vertical direction. For example, a material of the bottom electrode BE deposited on a single crystal substrate of a lanthanum aluminum oxide LaAlO$_3$ (LAO) may be a yttrium barium copper oxide YBa$_2$Cu$_3$O$_7$ (YBCO) film; a material of the variable resistor may be a crystalline praseodymium calcium manganese oxide Pr$_{1-x}$Ca$_x$MnO$_3$ (PCMO) film; and a material of the top electrode TE may be an Ag film deposited by sputtering. Further, in addition to the perovskite material as mentioned above, known ZnSe—Ge heterogeneous structures or metal oxides related to Ti, Nb, Hf, Zr, Ta, Ni, V, Zn, Sn, In, Th and Al may also be used as the material of said variable resistor. Based on the material of the variable resistor, a resistance characteristic of the non-volatile memory element 130 may be different. According to a direction of voltage applied between the top electrode TE and the bottom electrode BE, a resistance of the non-volatile memory element 130 may be inversely changed. The stored data of a resistive memory may be determined by reading the resistance of the material of the variable resistor.

Figure 2:
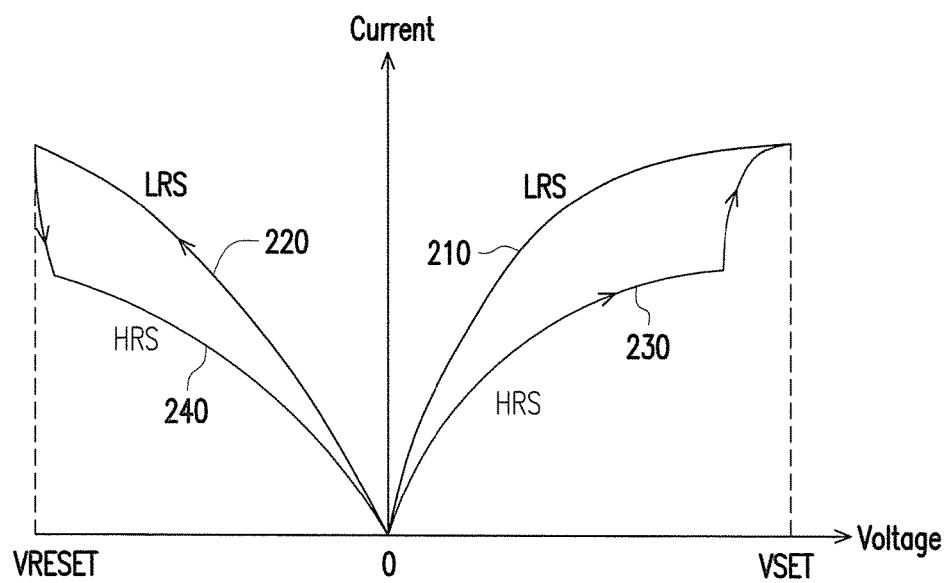
FIG. 2 is a schematic diagram illustrating a characteristic curve of the non-volatile memory element depicted in FIG. 1 according to an embodiment.

FIG. 2 is a schematic diagram illustrating a characteristic curve of the non-volatile memory element 130 depicted in FIG. 1 according to an embodiment. In FIG. 2, a horizontal axis represents a voltage difference between the top electrode TE and the bottom electrode BE (i.e., a voltage at the top electrode TE minus a voltage at the bottom electrode BE) of the non-volatile memory element 130, and a vertical axis represents a value of a current flowed through the non-volatile memory element 130. A curve 210 and a curve 220 represent a current-voltage characteristic curve of the non-volatile memory element 130 in a low resistance state LRS, and a curve 230 and a curve 240 represent a current-voltage characteristic curve of the non-volatile memory element 130 in a high resistance state HRS. Based on different materials, a resistance of the low resistance state LRS may be tens or hundreds Ohm (e.g., several KΩ), and a resistance of the high resistance state HRS may be more than dozens times of the resistance of the low resistance state LRS (e.g., 10K to 100MΩ). In the case when the non-volatile memory element 130 is in the high resistance state HRS (referring to the curve 230), when the voltage difference between the top electrode TE and the bottom electrode BE of the non-volatile memory element 130 is greater than a first threshold voltage (i.e., a set voltage VSET depicted in FIG. 2), the non-volatile memory element 130 starts a "set" operation to change a resistance state of the non-volatile memory element 130 from the high resistance state HRS to the low resistance state LRS. Referring to the curve 220, when the voltage difference between the top electrode TE and the bottom electrode BE of the non-volatile memory element 130 in the low resistance state LRS is less than a second threshold voltage (i.e., a reset voltage VRESET depicted in FIG. 2), the non-volatile memory element 130 starts a "reset" operation to change the resistance state of the non-volatile memory element 130 from the low resistance state LRS to the high resistance state HRS.

Figure 3:
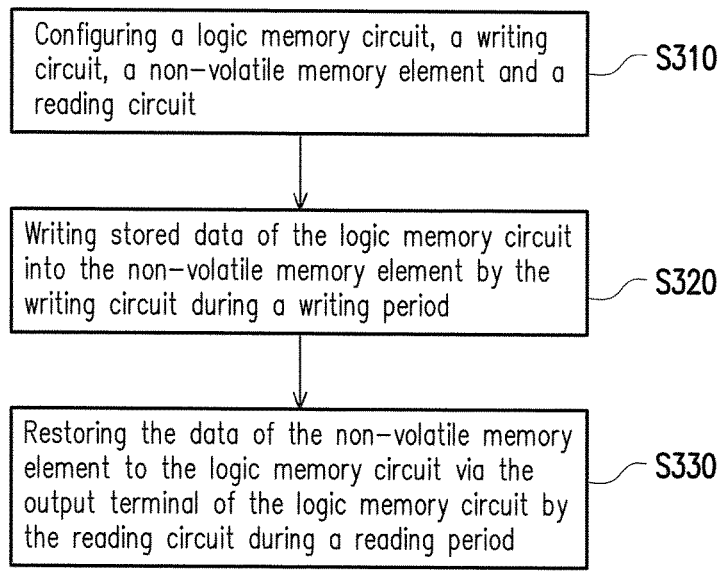
FIG. 3 is a flowchart illustrating an operating method of the non-volatile memory device according to embodiments of the present disclosure.

FIG. 3 is a flowchart illustrating an operating method of the non-volatile memory device 100 according to embodiments of the present disclosure. In step S310, the logic memory circuit 110, the writing circuit 120, the non-volatile memory element 130 and the reading circuit 140 are configured to the non-volatile memory device 100. During a normal operation period, the writing circuit 120 and the reading circuit 140 may be disabled, and the input terminal of the writing circuit 120 and/or the output terminal of the reading circuit 140 are in a floating state or a high impedance state. Therefore, the writing circuit 120, the non-volatile memory element 130 and the reading circuit 140 do not affect operation of the logic memory circuit 110 during the normal operation period.

During a writing period, the reading circuit 140 may be disabled, and the first input terminal and the second input terminal of the reading circuit 140 are in the floating state or the high impedance state. The writing circuit 120 writes (backs up) stored data of the logic memory circuit 110 into the non-volatile memory element 130 during the writing period (step S320). For instance (but not limited thereto), if the stored data of the logic memory circuit 110 is logic "1", the writing circuit 120 may set the resistance state of the non-volatile memory element 130 to the low resistance state LRS during the writing period. If the stored data of the logic memory circuit 110 is logic "0", the writing circuit 120 may reset the resistance state of the non-volatile memory element 130 to the high resistance state HRS during the writing period. The system, which includes the non-volatile memory device 400, is capable of determining whether to enter a standby mode (e.g., standby or shut down mode). When the system enters the standby or shut down (power off) mode, the non-volatile memory device 100 first performs a storing procedure (step S320, entering the writing period) to record information/data of the logic memory circuit 110 into the non-volatile memory element 130. After said storing procedure (step S320) is completed, the system may stop supplying power to the logic memory circuit 110, so as to reduce the power consumption of the logic memory circuit 110. At this point, the non-volatile memory device 100 has entered the standby or shut down state/mode.

When the non-volatile memory device 100 ends the standby or shut down state/mode, the non-volatile memory device 100 performs a restoring procedure (step S330, entering a reading period) to write the information stored by the non-volatile memory element 130 back to the logic memory circuit 110. In the restoring procedure, the output terminal (e.g., the output terminal Q or the output terminal QB) of the logic memory circuit 110 is still in a not-ready state (e.g., the floating state, the high impedance state or other unknown logic states). During the reading period, the writing circuit 120 may be disabled. When being disabled, the first output terminal and the second output terminal of the writing circuit 120 are in the floating state or the high impedance state. The reading circuit 140 restores the data of the non-volatile memory element 130 to the logic memory circuit 110 via the output terminal (e.g., the output terminal Q or the output terminal QB) of the logic memory circuit 110 during the reading period. For instance (but not limited thereto), if "the data" stored in the non-volatile memory element 130 is in the low resistance state LRS (equivalent to logic "1"), the reading circuit 140 may restore logic "1" to the logic memory circuit 110 via the output terminal the logic memory circuit 110 during the reading period. If "the data" stored in the non-volatile memory element 130 is in the high resistance state HRS (equivalent to logic "0"), the reading circuit 140 may restore logic "0" to the logic memory circuit 110 via the output terminal of the logic memory circuit 110 during the reading period. After said restoring procedure (step S330) is completed, the logic memory circuit 110 may then perform normal operations.

Accordingly, the non-volatile memory device 100 and the operating method thereof as described in the present embodiment integrate the logic memory circuit 110 and the non-volatile memory element 130 by utilizing a specific architecture. During the normal operation period, the writing circuit 120 and the reading circuit 140 are disabled. Therefore, the non-volatile memory element 130 will not affect operation of the logic memory circuit 110 during the normal operation period. During the writing period, the reading circuit 140 is disabled and the writing circuit 120 is enabled to write (back up) the stored data of the logic memory circuit 110 into the non-volatile memory element 130. During the reading period, the writing circuit 120 is disabled and the reading circuit 140 is enabled to restore the data of the non-volatile memory element 130 to the logic memory circuit 110.

Figure 4:
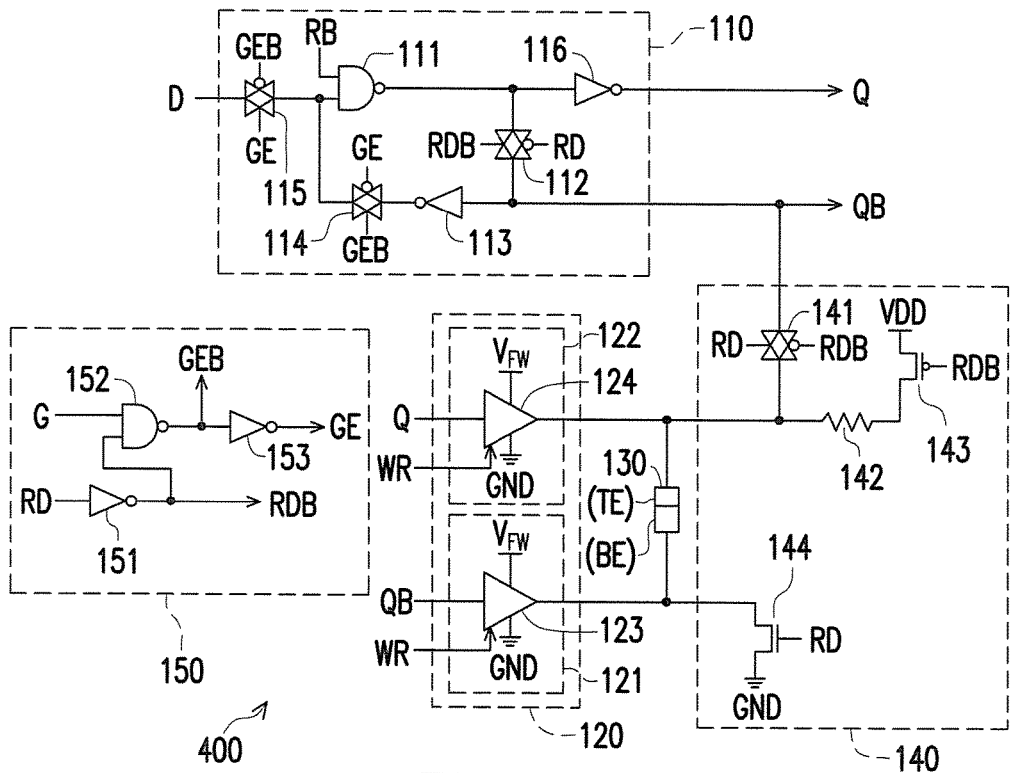
FIG. 4 is a block diagram illustrating circuitry of a non-volatile memory device according to another embodiment of the present disclosure.

FIG. 4 is a block diagram illustrating circuitry of a non-volatile memory device 400 according to another embodiment of the present disclosure. The non-volatile memory device 400 includes a logic memory circuit 110, a writing circuit 120, a non-volatile memory element 130, a reading circuit 140 and a control circuit 150. The logic memory circuit 110, the writing circuit 120, the non-volatile memory element 130 and the reading circuit 140 shown in FIG. 4 may be deduced by analogy with reference to related description in FIG. 1 to FIG. 3.

In the embodiment depicted in FIG. 4, the control circuit 150 includes a NOT gate 151, a NAND gate 152 and a NOT gate 153. An input terminal of the NOT gate 151 may receive a first read signal RD from a front stage circuit (e.g., a controller, not illustrated). An output terminal of the NOT gate 151 provides a second read signal RDB to the logic memory circuit 110 and the reading circuit 140, wherein the second read signal RDB is an inversion signal of the first read signal RD. A first input terminal of the NAND gate 152 may receive an original gate signal G from the front stage circuit (e.g., the controller, not illustrated). A second input terminal of the NAND gate 152 is coupled to the output terminal of the NOT gate 151 to receive the second read signal RDB. An output terminal of the NAND gate 152 provides a second gate signal GEB to the logic memory circuit 110. An input terminal of the NOT gate 153 is coupled to the output terminal of the NAND gate 152 to receive the second gate signal GEB. An output terminal of the NOT gate 153 provides a first gate signal GE to the logic memory circuit 110, wherein the first gate signal GE is an inversion signal of the second gate signal GEB.

In the embodiment depicted in FIG. 4, the logic memory circuit 110 includes a NAND gate 111, a transmission gate 112, a NOT gate 113, a transmission gate 114, a transmission gate 115 and a NOT gate 116. A P-channel gate of the transmission gate 115 is controlled by the second gate signal GEB. An N-channel gate of the transmission gate 115 is controlled by the first gate signal GE. A first terminal of the transmission gate 115 serves as the input terminal D of the logic memory circuit 110. A second terminal of the transmission gate 115 is coupled to a second input terminal of the NAND gate 111. A first input terminal of the NAND gate 111 may receive a reset signal RB from the front stage circuit (e.g., the controller, not illustrated). An input terminal of the NOT gate 116 is coupled to an output terminal of the NAND gate 111. An output terminal of the NOT gate 116 serves as the output terminal Q of the logic memory circuit 110.

A first terminal of the transmission gate 112 is coupled to the output terminal of the NAND gate 111. A second terminal of the transmission gate 112 is coupled to the output terminal QB of the logic memory circuit 110. A P-channel gate of the transmission gate 112 is controlled by the first read signal RD. An N-channel gate of the transmission gate 112 is controlled by the second read signal RDB. The transmission gate 112 is turned on during the normal operation period and the writing period. The transmission gate 112 is turned off during the reading period. An input terminal of the NOT gate 113 is coupled to the second terminal of the transmission gate 112. A first terminal of the transmission gate 114 is coupled to an output terminal of the NOT gate 113. A second terminal of the transmission gate 114 is coupled to the second input terminal of the NAND gate 111. A P-channel gate of the transmission gate 114 is controlled by the first gate signal GE. An N-channel gate of the transmission gate 114 is controlled by the second gate signal GEB.

In the embodiment depicted in FIG. 4, the writing circuit 120 includes a first level shifter 121 and a second level shifter 122. An input terminal of the first level shifter 121 is coupled to the output terminal QB of the logic memory circuit 110. An output terminal of the first level shifter 121 serves as the second output terminal of the writing circuit 120 to be coupled to the second terminal (e.g., the bottom electrode BE) of the non-volatile memory element 130. An enable-control terminal of the first level shifter 121 may receive a write signal WR from the front stage circuit (e.g., the controller, not illustrated). The first level shifter 121 is controlled by the write signal WR. The output terminal of the first level shifter 121 is disabled when the write signal WR is in a first logic state (e.g., logic "0"). When the write signal WR is in a second logic state (e.g., logic "1"), the output terminal of the first level shifter 121 decides to output a high write voltage (e.g., a forming voltage $V_{FW}$) or a low write voltage (e.g., a ground voltage GND) according to a signal at the output terminal QB of the logic memory circuit 110. Herein, a voltage difference between the high write voltage and the low write voltage is greater than a threshold voltage of the non-volatile memory element 130 (e.g., greater than an absolute value of the set voltage VSET depicted in FIG. 2, and/or greater than an absolute value of the reset voltage VRESET depicted in FIG. 2).

An input terminal of the second level shifter 122 is coupled to the output terminal Q of the logic memory circuit 110. An output terminal of the second level shifter 122 serves as the first output terminal of the writing circuit 120 to be coupled to the first terminal (e.g., the top electrode TE) of the non-volatile memory element 130. An enable-control terminal of the second level shifter 122 may receive the write signal WR from the front stage circuit (e.g., the controller, not illustrated). The second level shifter 122 is controlled by the write signal WR. The output terminal of the second level shifter 122 is disabled when the write signal WR is in the first logic state (e.g., logic "0"). When the write signal WR is in the second logic state (e.g., logic "1"), the output terminal of the second level shifter 122 decides to output the high write voltage (e.g., the forming voltage $V_{FW}$) or the low write voltage (e.g., the ground voltage GND) according to a signal at the output terminal Q of the logic memory circuit 110.

For instance, if the signal at the output terminal Q of the logic memory circuit 110 is logic "1" (i.e., the signal at the output terminal QB is logic "0") and the write signal WR is in the second logic state (e.g., logic "1"), the first level shifter 121 may change the signal at the output terminal Q to the high write voltage (e.g., the forming voltage $V_{FW}$) during the writing period, and the second level shifter 122 may change the signal at the output terminal QB to the low write voltage (e.g., the ground voltage GND) during the writing period. The high write voltage is transmitted to the first terminal (e.g., the top electrode TE) of the non-volatile memory element 130, and the low write voltage is transmitted to the second terminal (e.g., the bottom electrode BE) of the non-volatile memory element 130. Accordingly, the resistance state of the non-volatile memory element 130 is set to the low resistance state LRS. By analogy, when the signal at the output terminal Q of the logic memory circuit 110 is logic "0" (i.e., the signal at the output terminal QB is logic "1"), the resistance state of the non-volatile memory element 130 is then reset to the high resistance state HRS during the writing period.

The writing circuit 120 is not limited only to be implemented by using the first level shifter 121 and the second level shifter 122. For example, in another embodiment, the writing circuit 120 includes a first buffer 123 and a second buffer 124. An input terminal of the first buffer 123 is coupled to the output terminal QB of the logic memory circuit 110. An output terminal of the first buffer 123 serves as the second output terminal of the writing circuit 120 to be coupled to the second terminal (e.g., the bottom electrode BE) of the non-volatile memory element 130. A power terminal of the first buffer 123 is coupled to the high write voltage (e.g., the forming voltage $V_{FW}$). A reference voltage terminal of the first buffer 123 is coupled to the low write voltage (e.g., the ground voltage GND). A voltage difference between the forming voltage $V_{FW}$ and the ground voltage GND is greater than the threshold voltage of the non-volatile memory element 130 (e.g., greater than the absolute value of the set voltage VSET depicted in FIG. 2, and/or greater than the absolute value of the reset voltage VRESET depicted in FIG. 2). An enable-control terminal of the first buffer 123 may receive the write signal WR from the front stage circuit (e.g., the controller, not illustrated). The first buffer 123 is controlled by the write signal WR to decide whether to disable the output terminal of the first buffer 123.

An input terminal of the second buffer 124 is coupled to the output terminal Q of the logic memory circuit 110. An output terminal of the second buffer 124 serves as the first output terminal of the writing circuit 120 to be coupled to the first terminal (e.g., the top electrode TE) of the non-volatile memory element 130. A power terminal of the second buffer 124 is coupled to the high write voltage (e.g., the forming voltage $V_{FW}$). A reference voltage terminal of the second buffer 124 is coupled to the low write voltage (e.g., the ground voltage GND). An enable-control terminal of the second buffer 124 may receive the write signal WR from the front stage circuit (e.g., the controller, not illustrated). The second buffer is controlled by the write signal WR to decide whether to disable the output terminal of the second buffer 124.

If the signal at the output terminal Q of the logic memory circuit 110 is logic "1" (i.e., the signal at the output terminal QB is logic "0") and the write signal WR is in the second logic state (e.g., logic "1"), the first buffer 123 may change the signal at the output terminal Q to the high write voltage (e.g., the forming voltage $V_{FW}$) during the writing period, and the second buffer 124 may change the signal at the output terminal QB to the low write voltage (e.g., the ground voltage GND) during the writing period. Therefore, when the signal at the output terminal Q of the logic memory circuit 110 is logic "1" (i.e., the signal at the output terminal QB is logic "0"), the resistance state of the non-volatile memory element 130 is set to the low resistance state LRS. By analogy, when the signal at the output terminal Q of the logic memory circuit 110 is logic "0" (i.e., the signal at the output terminal QB is logic "1"), the resistance state of the non-volatile memory element 130 is then reset to the high resistance state HRS during the writing period.

In the embodiment depicted in FIG. 4, the reading circuit 140 includes a switch 141, a resistor 142, a switch 143 and a switch 144. A first terminal of the switch 141 serves as the output terminal of the reading circuit 140 to be coupled to the output terminal QB of the logic memory circuit 110. A second terminal of the switch 141 serves as the first input terminal of the reading circuit 140 to be coupled to the first terminal (e.g., the top electrode TE) of the non-volatile memory element 130. The switch 141 is controlled by the first read signal RD. The switch 141 is turned off during the normal operation period and the writing period. The switch 141 is turned on during the reading period. The switch 141 may be a transmission gate (or other switch elements/circuits), wherein a P-channel gate of said transmission gate is controlled by the second read signal RDB, and an N-channel gate of said transmission gate is controlled by the first read signal RD.

A first terminal of the resistor 142 is coupled to the second terminal of the switch 141. A first terminal of the switch 143 is coupled to a second terminal of the resistor 142. A second terminal of the switch 143 is coupled to a system voltage VDD. A control terminal of the switch 143 is controlled by the second read signal RDB. The switch 143 is turned off during the normal operation period and the writing period. The switch 143 is turned on during the reading period. The switch 143 may be a PMOS (P-channel metal oxide semiconductor) transistor (or other switch elements/circuits), wherein a gate of said PMOS transistor is controlled by the second read signal RDB as shown by FIG. 4. A first terminal of the switch 144 serves as the second input terminal of the reading circuit 140 to be coupled to the second terminal (e.g., the bottom electrode BE) of the non-volatile memory element 130. A second terminal of the switch 144 is coupled to a reference voltage (e.g., the ground voltage GND). A control terminal of the switch 144 is controlled by the first read signal RD. The switch 144 is turned off during the normal operation period and the writing period. The switch 144 is turned on during the reading period. The switch 144 may be an NMOS (N-channel metal oxide semiconductor) transistor (or other switch elements/circuits), wherein a gate of said NMOS transistor is controlled by the first read signal RD, as shown by FIG. 4.

The switch 141, the switch 143 and the switch 144 are turned on during the reading period. If the resistance state of the non-volatile memory element 130 is the low resistance state LRS (equivalent to logic "1"), a resistor string formed by the resistor 142 and the non-volatile memory element 130 may provide a divided voltage (a logic low voltage) to the switch 141. The switch 141 may restore the logic low voltage (equivalent to logic "0") to the logic memory circuit 110 via the output terminal QB of the logic memory circuit 110. Therefore, after the reading period ends, the signal at the output terminal QB of the logic memory circuit 110 is restored to logic "0" (i.e., the signal at the output terminal Q is restored to logic "1"). If the resistance state of the non-volatile memory element 130 is the high resistance state LRS (equivalent to logic "0"), the resistor string formed by the resistor 142 and the non-volatile memory element 130 may provide a divided voltage (a logic high voltage) to the switch 141. The switch 141 may restore the logic high voltage (equivalent to logic "1") to the logic memory circuit 110 via the output terminal QB of the logic memory circuit 110. Therefore, after the reading period ends, the signal at the output terminal QB of the logic memory circuit 110 is restored to logic "1" (i.e., the signal at the output terminal Q is restored to logic "0"). After said reading period ends, the logic memory circuit 110 may perform normal operations.

Figure 5:
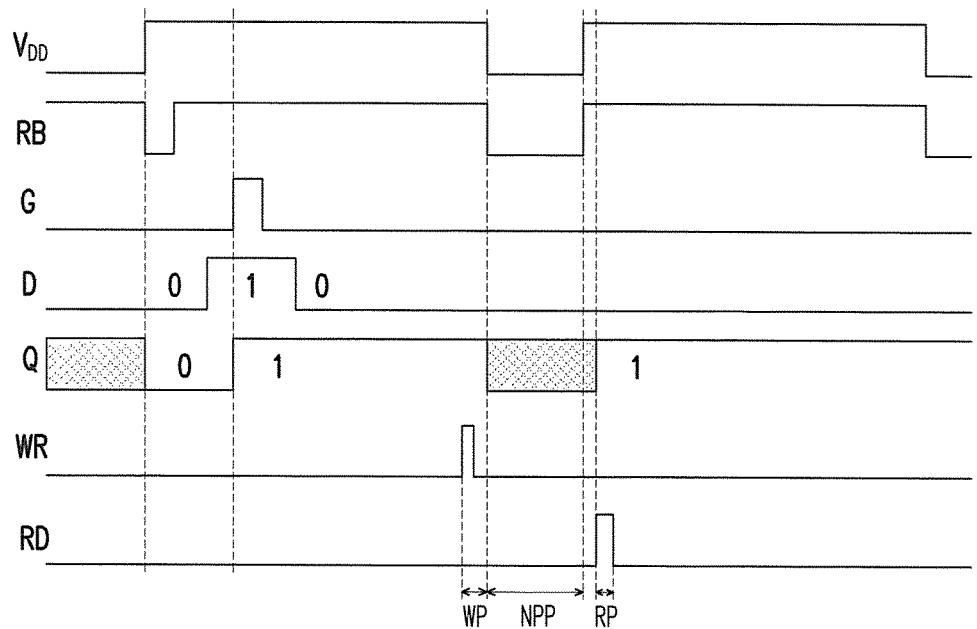
FIG. 5 is a schematic diagram illustrating a signal time sequence of the circuits depicted in FIG. 4 according to an embodiment of the present disclosure.

FIG. 5 is a schematic diagram illustrating a signal time sequence of the circuits depicted in FIG. 4 according to an embodiment of the present disclosure. As illustrated in FIG. 5, a horizontal axis represents time and a vertical axis represents voltage. As shown in FIG. 5, before proceeding to the storing procedure (a writing period WP), the output terminal Q of the logic memory circuit 110 is in a high voltage level (e.g., logic "1"), that is, the output terminal QB of the logic memory circuit 110 is logic "0". Before the system enters the standby or shut down (power off) modes, the non-volatile memory device 400 first performs the storing procedure (the writing period WP) to record information/data of the logic memory circuit 110 into the non-volatile memory element 130. During the writing period WP, the write signal WR is pulled up to the high voltage level (e.g., logic "1"), such that the second buffer 124 may change the signal (logic "1") at the output terminal Q to the high write voltage (e.g., the forming voltage $V_{FW}$) and the first buffer 123 may change the signal (logic "0") at the output terminal QB to the low write voltage (e.g., the ground voltage GND). Meanwhile, a current provided by the second buffer 124 flows from the top electrode TE of the non-volatile memory element 130 to the bottom electrode BE of the non-volatile memory element 130, so that the resistance state of the non-volatile memory element 130 is set to the low resistance state LRS.

After the storing procedure (the writing period WP) is completed, the non-volatile memory device 400 may enter a no power-supply period NPP. During the no power-supply period NPP, the system may stop supply power to the logic memory circuit 110, the writing circuit 120 and the reading circuit 140, so as to reduce the power consumption. At this point, the non-volatile memory device 400 has entered the standby or shut down states/modes.

When the no power-supply period NPP ends, the system may resume supplying power to the logic memory circuit 110, the writing circuit 120 and the reading circuit 140. After the no power-supply period NPP ends, the non-volatile memory device 400 may perform the restoring procedure (entering a reading period RP) to write the data stored by the non-volatile memory element 130 back to the logic memory circuit 110. In the restoring procedure, the read signal RD is pulled up to the high voltage level (e.g., logic "1"), so that the switch 141, the switch 143 and the switch 144 are turned on. Since the resistance state of the non-volatile memory element 130 is the low resistance state LRS (equivalent to logic "1"), the voltage at the output terminal QB of the logic memory circuit 110 is pulled down so the output terminal Q of the logic memory circuit 110 outputs the high voltage level (equivalent to logic "1"). Therefore, after the reading period RP ends, the signal at the output terminal QB of the logic memory circuit 110 is restored to logic "0", that is, the signal at the output terminal Q is restored back to logic "1".

Figure 6:
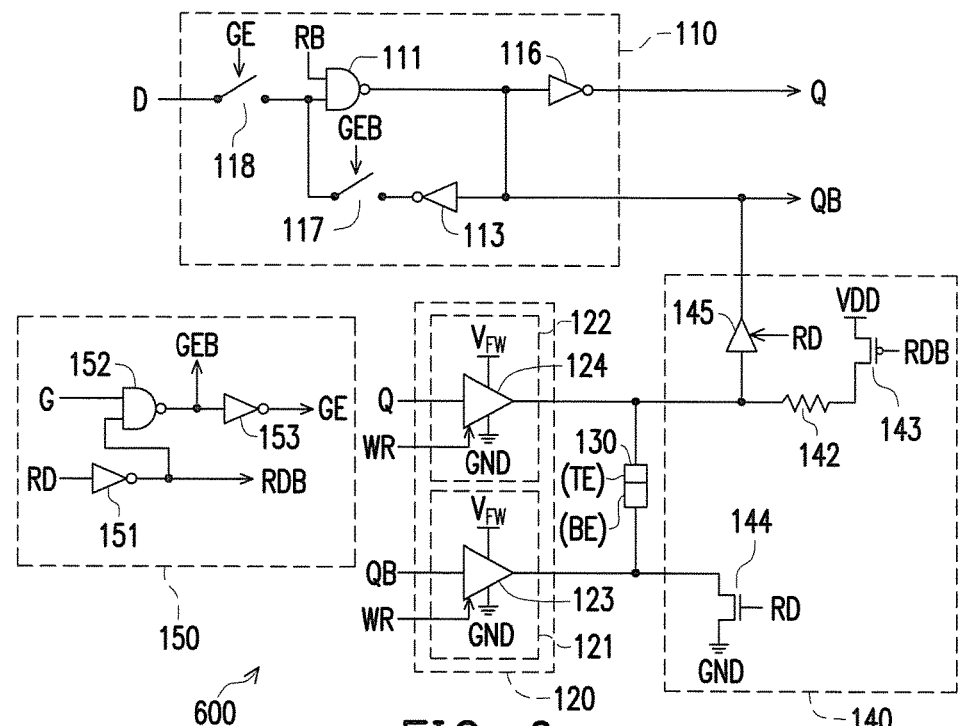
FIG. 6 is a block diagram illustrating circuitry of a non-volatile memory device according to yet another embodiment of the present disclosure.

FIG. 6 is a block diagram illustrating circuitry of a non-volatile memory device 600 according to yet another embodiment of the present disclosure. The non-volatile memory device 600 includes a logic memory circuit 110, a writing circuit 120, a non-volatile memory element 130, a reading circuit 140 and a control circuit 150. The logic memory circuit 110, the writing circuit 120, the non-volatile memory element 130 and the reading circuit 140 in FIG. 6 may be deduced by analogy with reference to related description in FIG. 1 to FIG. 3. The writing circuit 120, the non-volatile memory element 130, the reading circuit 140 and the control circuit 150 in FIG. 6 may refer to related description in FIG. 4, which is not repeated hereinafter.

Referring to FIG. 6, the logic memory circuit 110 includes a NAND gate 111, a NOT gate 113, a NOT gate 116, a switch 117 and a switch 118. The switch 118 is controlled by a gate signal GE. A first terminal of the switch 118 serves as the input terminal D of the logic memory circuit 110. A second terminal of the switch 118 is coupled to a second input terminal of the NAND gate 111. A first input terminal of the NAND gate 111 is coupled to a reset signal RB. An input terminal of the NOT gate 116 is coupled to an output terminal of the NAND gate 111. An output terminal of the NOT gate 116 serves as the output terminal Q of the logic memory circuit 110. An output terminal of the NAND gate 111 is coupled to the output terminal QB of the logic memory circuit 110. An input terminal of the NOT gate 113 is coupled to an output terminal of the NAND gate 111. A first terminal of the switch 117 is coupled to an output terminal of the NOT gate 113. A second terminal of the switch 117 is coupled to a second input terminal of the NAND gate 111. The switch 117 is controlled by a gate signal GEB.

In the embodiment depicted in FIG. 6, the reading circuit 140 includes a resistor 142, a switch 143, a switch 144 and a buffer 145. An output terminal of the buffer 145 serves as the output terminal of the reading circuit 140 to be coupled to the output terminal QB of the logic memory circuit 110. An input terminal of the buffer 145 serves as the first input terminal of the reading circuit 140 to be coupled to the first terminal (e.g., the top electrode TE) of the non-volatile memory element 130. The buffer 145 is controlled by the first read signal RD. The buffer 145 is disabled during the normal operation period and the writing period. The buffer 145 is enabled during the reading period. A first terminal of the resistor 142 is coupled to the input terminal of the buffer 145. A first terminal of the switch 143 is coupled to a second terminal of the resistor 142. A second terminal of the switch 143 is coupled to a system voltage VDD. A control terminal of the switch 143 is controlled by the second read signal RDB. A first terminal of the switch 144 serves as the second input terminal of the reading circuit 140 to be coupled to the second terminal (e.g., the bottom electrode BE) of the non-volatile memory element 130. A second terminal of the switch 144 is coupled to a reference voltage (e.g., the ground voltage GND). A control terminal of the switch 144 is controlled by the first read signal RD. The switch 143 and the switch 144 are turned off during the normal operation period and the writing period. The switch 143 and the switch 144 are turned on during the reading period.

The buffer 145 is enabled and the switch 143 and the switch 144 are turned on during the reading period. If the resistance state of the non-volatile memory element 130 is the low resistance state LRS (equivalent to logic "1"), a resistor string formed by the resistor 142 and the non-volatile memory element 130 may provide a divided voltage (the logic low voltage) to the buffer 145. The buffer 145 may restore the logic low voltage (equivalent to logic "0") to the logic memory circuit 110 via the output terminal QB of the logic memory circuit 110. Therefore, after the reading period ends, the signal at the output terminal QB of the logic memory circuit 110 is restored to logic "0" (i.e., the signal at the output terminal Q is restored to logic "1"). If the resistance state of the non-volatile memory element 130 is the high resistance state HRS (equivalent to logic "0"), a resistor string formed by the resistor 142 and the non-volatile memory element 130 may provide a divided voltage (the logic high voltage) to the buffer 145. The buffer 145 may restore the logic high voltage (equivalent to logic "1") to the logic memory circuit 110 via the output terminal QB of the logic memory circuit 110. Therefore, after the reading period ends, the signal at the output terminal QB of the logic memory circuit 110 is restored to logic "1" (i.e., the signal at the output terminal Q is restored to logic "0"). After said reading period ends, the logic memory circuit 110 may perform normal operations.

Figure 7:
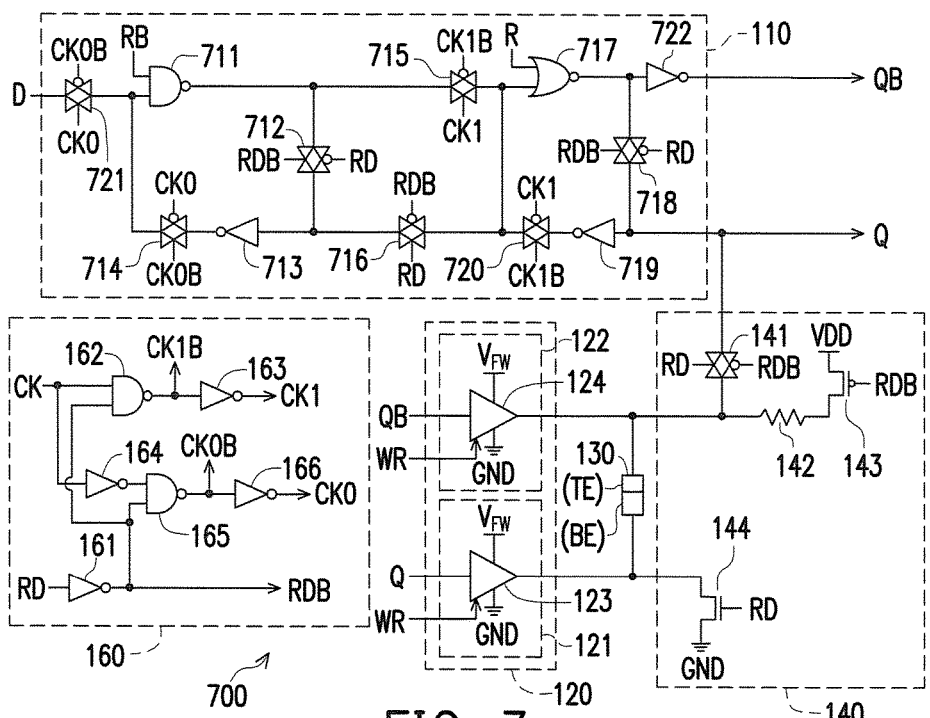
FIG. 7 is a block diagram illustrating circuitry of a non-volatile memory device according to still another embodiment of the present disclosure.

FIG. 7 is a block diagram illustrating circuitry of a non-volatile memory device 700 according to still another embodiment of the present disclosure. The non-volatile memory device 700 includes a logic memory circuit 110, a writing circuit 120, a non-volatile memory element 130, a reading circuit 140 and a control circuit 160. The logic memory circuit 110, the writing circuit 120, the non-volatile memory element 130 and the reading circuit 140 in FIG. 7 may be deduced by analogy with reference to related description in FIG. 1 to FIG. 3. The writing circuit 120, the non-volatile memory element 130 and the reading circuit 140 in FIG. 7 may refer to related description in FIG. 4, which is not repeated hereinafter.

In the embodiment depicted in FIG. 7, the control circuit 160 includes a NOT gate 161, a NAND gate 162, a NOT gate 163, a NOT gate 164, a NAND gate 165 and a NOT gate 166. An input terminal of the NOT gate 161 may receive a first read signal RD from a front stage circuit (e.g., a controller, not illustrated). An output terminal of the NOT gate 161 provides a second read signal RDB to the logic memory circuit 110 and the reading circuit 140, wherein the second read signal RDB is an inversion signal of the first read signal RD. A first input terminal of the NAND gate 162 may receive an original clock signal CK from the front stage circuit (e.g., the controller, not illustrated). A second input terminal of the NAND gate 162 is coupled to the output terminal of the NOT gate 161 to receive the second read signal RDB. An output terminal of the NAND gate 162 provides a clock signal CK1B to the logic memory circuit 110. An input terminal of the NOT gate 163 is coupled to the output terminal of the NAND gate 162 to receive the clock signal CK1B. An output terminal of the NOT gate 163 provides a clock signal CK1 to the logic memory circuit 110, wherein the clock signal CK1 is an inversion signal of the clock signal CK1B. An input terminal of the NOT gate 164 receives the original clock signal CK. A first input terminal of the NAND gate 165 is coupled to an output terminal of the NOT gate 164. A second input terminal of the NAND gate 165 is coupled to the output terminal of the NOT gate 161 to receive the second read signal RDB. An output terminal of the NAND gate 165 provides a clock signal CK0B to the logic memory circuit 110. An input terminal of the NOT gate 166 is coupled to the output terminal of the NAND gate 165 to receive the clock signal CK0B. An output terminal of the NOT gate 166 provides a clock signal CK0 to the logic memory circuit 110.

In the embodiment depicted in FIG. 7, the logic memory circuit 110 includes a NAND gate 711, a transmission gate 712, a NOT gate 713, a transmission gate 714, a transmission gate 715, a transmission gate 716, a NOR gate 717, a transmission gate 718, a NOT gate 719, a transmission gate 720, a transmission gate 721 and a NOT gate 722. A P-channel gate of the transmission gate 721 is controlled by the clock signal CK0B. An N-channel gate of the transmission gate 721 is controlled by the clock signal CK0. A first terminal of the transmission gate 721 serves as the input terminal D of the logic memory circuit 110. A second terminal of the transmission gate 721 is coupled to a second input terminal of the NAND gate 711. A first input terminal of the NAND gate 711 may receive a reset signal RB from the front stage circuit (e.g., the controller, not illustrated). A first terminal of the transmission gate 712 is coupled to the output terminal of the NAND gate 711. A P-channel gate of the transmission gate 712 is controlled by the first read signal RD. An N-channel gate of the transmission gate 712 is controlled by the second read signal RDB. The transmission gate 712 is turned on during the normal operation period and the writing period. The transmission gate 712 is turned off during the reading period. An input terminal of the NOT gate 713 is coupled to the second terminal of the transmission gate 712. A first terminal of the transmission gate 714 is coupled to an output terminal of the NOT gate 713. A second terminal of the transmission gate 714 is coupled to a second input terminal of the NAND gate 711. A P-channel gate of the transmission gate 714 is controlled by the clock signal CK0. An N-channel gate of the transmission gate 714 is controlled by the clock signal CK0B.

A first terminal of the transmission gate 715 is coupled to the output terminal of the NAND gate 711. An N-channel gate of the transmission gate 715 is controlled by the clock signal CK1. A P-channel gate of the transmission gate 715 is controlled by the clock signal CK1B. A first terminal of the transmission gate 716 is coupled to the input terminal of the NOT gate 713. An N-channel gate of the transmission gate 716 is controlled by the first read signal RD. A P-channel gate of the transmission gate 716 is controlled by the second read signal RDB. The transmission gate 716 is turned off during the normal operation period and the writing period. The transmission gate 716 is turned on during the reading period. A first input terminal of the NOR gate 717 may receive a reset signal R from the front stage circuit (e.g., the controller, not illustrated), wherein the reset signal R is an inversion signal of the reset signal RB. A second input terminal of the NOR gate 717 is coupled to a second terminal of the transmission gate 715. An input terminal of the NOT gate 722 is coupled to an output terminal of the NOR gate 717. An output terminal of the NOT gate 722 serves as the output terminal QB of the logic memory circuit 110. A first terminal of the transmission gate 718 is coupled to the output terminal of the NOR gate 717. A second terminal of the transmission gate 718 is coupled to the output terminal Q of the logic memory circuit 110. A P-channel gate of the transmission gate 718 is controlled by the first read signal RD. An N-channel gate of the transmission gate 718 is controlled by the second read signal RDB. The transmission gate 718 is turned on during the normal operation period and the writing period. The transmission gate 718 is turned off during the reading period. An input terminal of the NOT gate 719 is coupled to the second terminal of the transmission gate 718. A first terminal of the transmission gate 720 is coupled to an output terminal of the NOT gate 719. A second terminal of the transmission gate 720 is coupled to the second input terminal of the NOR gate 717 and a second terminal of the transmission gate 716. A P-channel gate of the transmission gate 720 is controlled by the clock signal CK1. An N-channel gate of the transmission gate 720 is controlled by the clock signal CK1B.

In the embodiment depicted in FIG. 7, the writing circuit 120 includes a first level shifter 121 and a second level shifter 122. An input terminal of the first level shifter 121 is coupled to the output terminal Q of the logic memory circuit 110. An output terminal of the first level shifter 121 serves as the second output terminal of the writing circuit 120 to be coupled to the second terminal (e.g., the bottom electrode BE) of the non-volatile memory element 130. An input terminal of the second level shifter 122 is coupled to the output terminal QB of the logic memory circuit 110. An output terminal of the second level shifter 122 serves as the first output terminal of the writing circuit 120 to be coupled to the first terminal (e.g., the top electrode TE) of the non-volatile memory element 130.

The writing circuit 120 is not limited only to be implemented by using the first level shifter 121 and the second level shifter 122. For example, in another embodiment, the writing circuit 120 includes a first buffer 123 and a second buffer 124. In the embodiment depicted in FIG. 7, an input terminal of the first buffer 123 is coupled to the output terminal Q of the logic memory circuit 110. An output terminal of the first buffer 123 serves as the second output terminal of the writing circuit 120 to be coupled to the second terminal (e.g., the bottom electrode BE) of the non-volatile memory element 130. An input terminal of the second buffer 124 is coupled to the output terminal QB of the logic memory circuit 110. An output terminal of the second buffer 124 serves as the first output terminal of the writing circuit 120 to be coupled to the first terminal (e.g., the top electrode TE) of the non-volatile memory element 130.

In the embodiment depicted in FIG. 7, the reading circuit 140 includes a switch 141, a resistor 142, a switch 143 and a switch 144. A first terminal of the switch 141 serves as the output terminal of the reading circuit 140 to be coupled to the output terminal Q of the logic memory circuit 110. A second terminal of the switch 141 serves as the first input terminal of the reading circuit 140 to be coupled to the first terminal (e.g., the top electrode TE) of the non-volatile memory element 130. A first terminal of the resistor 142 is coupled to the second terminal of the switch 141. A first terminal of the switch 143 is coupled to a second terminal of the resistor 142. A second terminal of the switch 143 is coupled to a system voltage VDD. A first terminal of the switch 144 serves as the second input terminal of the reading circuit 140 to be coupled to the second terminal (e.g., the bottom electrode BE) of the non-volatile memory element 130. A second terminal of the switch 144 is coupled to a reference voltage (e.g., the ground voltage GND).

Figure 8:
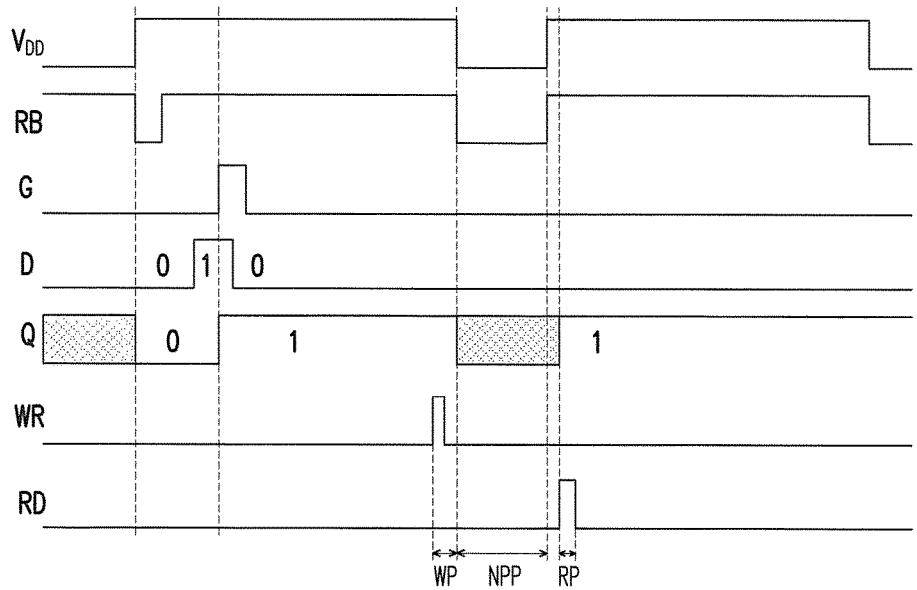
FIG. 8 is a schematic diagram illustrating a signal time sequence of the circuits depicted in FIG. 7 according to an embodiment of the present disclosure.

FIG. 8 is a schematic diagram illustrating a signal time sequence of the circuits depicted in FIG. 7 according to an embodiment of the present disclosure. As illustrated in FIG. 8, a horizontal axis represents time and a vertical axis represents voltage. As shown in FIG. 8, before proceeding to the storing procedure (a writing period WP), the output terminal Q of the logic memory circuit 110 is in a high voltage level (e.g., logic "1"), that is, the output terminal QB of the logic memory circuit 110 is logic "0". Before the system enters the standby or shut down (power off) modes, the non-volatile memory device 700 first performs the storing procedure (the writing period WP) to record information/data of the logic memory circuit 110 into the non-volatile memory element 130. During the writing period WP, the write signal WR is pulled up to the high voltage level (e.g., logic "1"), such that the first buffer 123 may change the signal (logic "1") at the output terminal Q to the high write voltage (e.g., the forming voltage $V_{FW}$) and the second buffer 124 may change the signal (logic "0") at the output terminal QB to the low write voltage (e.g., the ground voltage GND). Meanwhile, a current provided by the first buffer 123 flows from the bottom electrode BE of the non-volatile memory element 130 to the top electrode TE of the non-volatile memory element 130, so that the resistance state of the non-volatile memory element 130 is reset to the high resistance state HRS.

After the storing procedure (the writing period WP) is completed, the non-volatile memory device 700 may enter a no power-supply period NPP. During the no power-supply period NPP, the system may stop supply power to the logic memory circuit 110, the writing circuit 120 and the reading circuit 140, so as to reduce the power consumption. At this point, the non-volatile memory device 700 has entered the standby or shut down states/modes.

When the no power-supply period NPP ends, the system may resume supplying power to the logic memory circuit 110, the writing circuit 120 and the reading circuit 140. After the no power-supply period NPP ends, the non-volatile memory device 700 may perform the restoring procedure (entering a reading period RP) to write the data stored by the non-volatile memory element 130 back to the logic memory circuit 110. In the restoring procedure, the read signal RD is pulled up to the high voltage level (e.g., logic "1"), so that the switch 141, the switch 143 and the switch 144 are turned on. Since the resistance state of the non-volatile memory element 130 is the high resistance state HRS (equivalent to logic "1"), the voltage at the output terminal Q of the logic memory circuit 110 is pulled up so the output terminal QB of the logic memory circuit 110 outputs the low voltage level (equivalent to logic "0"). Therefore, after the reading period RP ends, the signal at the output terminal Q of the logic memory circuit 110 is restored back to logic "1", that is, the signal at the output terminal QB is restored back to logic "0".

Figure 9:
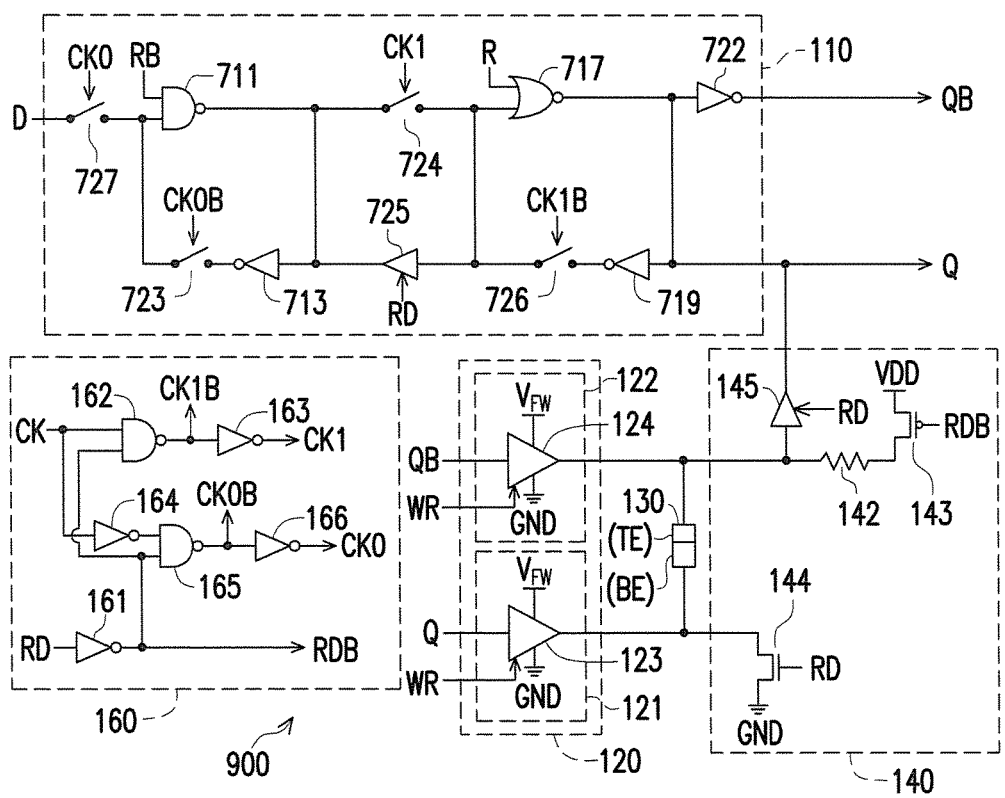
FIG. 9 is a block diagram illustrating circuitry of a non-volatile memory device according to yet still another embodiment of the present disclosure.

FIG. 9 is a block diagram illustrating circuitry of a non-volatile memory device 900 according to yet still another embodiment of the present disclosure. The non-volatile memory device 900 includes a logic memory circuit 110, a writing circuit 120, a non-volatile memory element 130, a reading circuit 140 and a control circuit 160. The logic memory circuit 110, the writing circuit 120, the non-volatile memory element 130 and the reading circuit 140 in FIG. 9 may be deduced by analogy with reference to related description in FIG. 1 to FIG. 3. The writing circuit 120, the non-volatile memory element 130, the reading circuit 140 and the control circuit 160 in FIG. 9 may refer to related description in FIG. 7, which is not repeated hereinafter.

Referring to FIG. 9, the logic memory circuit 110 includes a NAND gate 711, a NOT gate 713, a NOR gate 717, a NOT gate 719, a NOT gate 722, a switch 723, a switch 724, a buffer 725, a switch 726 and a switch 727. A first terminal of the switch 727 serves as the input terminal D of the logic memory circuit 110. A second terminal of the switch 727 is coupled to a second input terminal of the NAND gate 711. The switch 727 is controlled by a control signal CK0. A first input terminal of the NAND gate 711 is coupled to a reset signal RB. An input terminal of the NOT gate 713 is coupled to an output terminal of the NAND gate 711. A first terminal of the switch 723 is coupled to an output terminal of the NOT gate 713. A second terminal of the switch 723 is coupled to a second input terminal of the NAND gate 711. The switch 723 is controlled by a control signal CK0B. A first terminal of the switch 724 is coupled to the output terminal of the NAND gate 711. The switch 724 is controlled by a control signal CK1. An output terminal of the buffer 725 is coupled to the input terminal of the NOT gate 713. The buffer 725 is controlled by the read signal RD.

A first input terminal of the NOR gate 717 is coupled to a reset signal R. A second input terminal of the NOR gate 717 is coupled to a second terminal of the switch 724. An output terminal of the NOR gate 717 is coupled to the output terminal Q of the logic memory circuit 110. An input terminal of the NOT gate 722 is coupled to the output terminal of the NOR gate 717. An output terminal of the NOT gate 722 serves as the output terminal QB of the logic memory circuit 110. An input terminal of the NOT gate 719 is coupled to the output terminal of the NOR gate 717. A first terminal of the switch 726 is coupled to an output terminal of the NOT gate 719. A second terminal of the switch 726 is coupled to the second input terminal of the NOR gate 717 and an input terminal of the buffer 725. The switch 726 is controlled by a control signal CK1B.

In the embodiment depicted in FIG. 9, the reading circuit 140 includes a resistor 142, a switch 143, a switch 144 and a buffer 145. An output terminal of the buffer 145 serves as the output terminal of the reading circuit 140 to be coupled to the output terminal Q of the logic memory circuit 110. The reading circuit 140 in FIG. 9 may refer to related description in FIG. 6, which is not repeated hereinafter.

It should be noted that, under different application scenarios, related functions of the logic memory circuit 110, the writing circuit 120 and/or the reading circuit 140 described in the foregoing embodiments may be implemented as firmware or hardware by utilizing a common hardware description language (e.g., Verilog HDL or VHDL) or other suitable programming languages. The firmware capable of executing the related functions can be arranged into any known computer-accessible media such as magnetic tapes, semiconductor memories, magnetic disks or compact disks (e.g., CD-ROM or DVD-ROM); or the firmware may be transmitted via the Internet, a wired communication, a wireless communication or other communication mediums. Said firmware can be stored in the computer-accessible media, so that a computer processor can access/execute programming codes of the firmware. In addition, the device and the method of the present disclosure can also be implemented by a combination of software and hardware.

In summary, the non-volatile memory device and the operating method thereof as described in various embodiments of the present disclosure are capable of integrating the logic memory circuit 110 and the non-volatile memory element 130 by utilizing the specific architecture. During the normal operation period, the writing circuit 120 and the reading circuit 140 are disabled. Therefore, the non-volatile memory element 130 will not affect operation of the logic memory circuit during the normal operation period. During the writing period, the reading circuit 140 is disabled and the writing circuit 120 is enabled to write (back up) the stored data of the logic memory circuit 110 into the non-volatile memory element 130. During the reading period, the reading circuit 120 is disabled and the reading circuit 140 is enabled to restore the data of the non-volatile memory element 130 to the logic memory circuit 110.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims and their equivalents.

What is claimed is:

1. A non-volatile memory device, comprising:
   a logic memory circuit;
   a non-volatile memory element;
   a writing circuit, having an input terminal coupled to an output terminal of the logic memory circuit to receive stored data of the logic memory circuit, a first output terminal of the writing circuit being coupled to a first terminal of the non-volatile memory element, a second output terminal of the writing circuit being coupled to a second terminal of the non-volatile memory element, wherein the writing circuit writes the stored data into the non-volatile memory element during a writing period; and
   a reading circuit, having a first input terminal coupled to the first terminal of the non-volatile memory element, a second input terminal of the reading circuit being coupled to the second terminal of the non-volatile memory element, an output terminal of the reading circuit being coupled to the output terminal of the logic memory circuit, wherein the reading circuit restores the data of the non-volatile memory element to the logic memory circuit via the output terminal of the logic memory circuit during a reading period.

2. The non-volatile memory device of claim 1, wherein the logic memory circuit comprises:
   a NAND gate, having a first input terminal coupled to a reset signal;
   a first transmission gate, having a first terminal coupled to an output terminal of the NAND gate, a second terminal of the first transmission gate being coupled to the output terminal of the logic memory circuit, a P-channel gate of the first transmission gate being controlled by a first read signal, an N-channel gate of the first transmission gate being controlled by a second read signal, wherein the second read signal is an inversion signal of the first read signal, and the first transmission gate is turned on during a normal operation period and the writing period, and the first transmission gate is turned off during the reading period;
   a first NOT gate, having an input terminal coupled to the second terminal of the first transmission gate; and
   a second transmission gate, having a first terminal coupled to an output terminal of the first NOT gate, a second terminal of the second transmission gate being coupled to a second input terminal of the NAND gate, a P-channel gate of the second transmission gate being controlled by a first gate signal, an N-channel gate of the second transmission gate being controlled by a second gate signal, wherein the second gate signal is an inversion signal of the first gate signal.

3. The non-volatile memory device of claim 2, wherein the logic memory circuit further comprises:
   a third transmission gate, having a first terminal serving as an input terminal of the logic memory circuit, a second terminal of the third transmission gate being coupled to the second input terminal of the NAND gate, a P-channel gate of the third transmission gate being controlled by the second gate signal, and an N-channel gate of the third transmission gate being controlled by the first gate signal.

4. The non-volatile memory device of claim 2, further comprising:
   a second NOT gate, having an input terminal receiving the first read signal, and an output terminal of the second NOT gate providing the second read signal;
   a second NAND gate, having a first input terminal receiving an original gate signal, a second input terminal of the second NAND gate being coupled to the output terminal of the second NOT gate, and an output terminal of the second NAND gate providing the second gate signal; and
   a third NOT gate, having an input terminal coupled to the output terminal of the second NAND gate to receive the second gate signal, an output terminal of the third NOT gate providing the first gate signal.

5. The non-volatile memory device of claim 1, wherein the logic memory circuit comprises:
   a NAND gate, having a first input terminal coupled to a reset signal, an output terminal of the NAND gate being coupled to the output terminal of the logic memory circuit;
   a first NOT gate, having an input terminal coupled to the output terminal of the NAND gate; and
   a first switch, having a first terminal coupled to an output terminal of the first NOT gate, a second terminal of the first switch being coupled to a second input terminal of the NAND gate, the first switch being controlled by a first gate signal.

6. The non-volatile memory device of claim 5, wherein the logic memory circuit further comprises:
   a second switch, having a first terminal serving as an input terminal of the logic memory circuit, a second terminal of the second switch being coupled to the second input terminal of the NAND gate, the second switch being controlled by a second gate signal, wherein the second gate signal is an inversion signal of the first gate signal.

7. The non-volatile memory device of claim 1, wherein the logic memory circuit comprises:
   a first NAND gate, having a first input terminal coupled to a first reset signal;
   a first transmission gate, having a first terminal coupled to an output terminal of the first NAND gate, a P-channel gate of the first transmission gate being controlled by a first read signal, an N-channel gate of the first transmission gate being controlled by a second read signal, wherein the second read signal is an inversion signal of the first read signal, and the first transmission gate is turned on during a normal operation period and the writing period, and the first transmission gate is turned off during the reading period;
   a first NOT gate, having an input terminal coupled to a second terminal of the first transmission gate;
   a second transmission gate, having a first terminal coupled to an output terminal of the first NOT gate, a second terminal of the second transmission gate being coupled to a second input terminal of the first NAND gate, a P-channel gate of the second transmission gate being controlled by a first clock signal, an N-channel gate of the second transmission gate being controlled by a second clock signal, wherein the second clock signal is an inversion signal of the first clock signal;
   a third transmission gate, having a first terminal coupled to the output terminal of the first NAND gate, an N-channel gate of the third transmission gate being controlled by a third clock signal, a P-channel gate of the third transmission gate being controlled by a fourth clock signal, wherein the fourth clock signal is an inversion signal of the third clock signal;

a fourth transmission gate, having a first terminal coupled to the input terminal of the first NOT gate, an N-channel gate of the fourth transmission gate being controlled by the first read signal, a P-channel gate of the fourth transmission gate being controlled by the second read signal, wherein the fourth transmission gate is turned off during the normal operation period and the writing period, and the fourth transmission gate is turned on during the reading period;

a NOR gate, having a first input terminal coupled to a second reset signal, a second input terminal of the NOR gate being coupled to a second terminal of the third transmission gate, wherein the second reset signal is an inversion signal of the first reset signal;

a fifth transmission gate, having a first terminal coupled to an output terminal of the NOR gate, a second terminal of the fifth transmission gate being coupled to the output terminal of the logic memory circuit, a P-channel gate of the fifth transmission gate being controlled by the first read signal, an N-channel gate of the fifth transmission gate being controlled by the second read signal, wherein the fifth transmission gate is turned on during the normal operation period and the writing period, and the fifth transmission gate is turned off during the reading period;

a second NOT gate, having an input terminal coupled to the second terminal of the fifth transmission gate; and a sixth transmission gate, having a first terminal coupled to an output terminal of the second NOT gate, a second terminal of the sixth transmission gate being coupled to the second input terminal of the NOR gate and a second terminal of the fourth transmission gate, a P-channel gate of the sixth transmission gate being controlled by the third clock signal, an N-channel gate of the sixth transmission gate being controlled by the fourth clock signal.

8. The non-volatile memory device of claim 7, further comprising:

a third NOT gate, having an input terminal receiving the first read signal, an output terminal of the third NOT gate providing the second read signal;

a second NAND gate, having a first input terminal receiving an original clock signal, a second input terminal of the second NAND gate being coupled to the output terminal of the third NOT gate, an output terminal of the second NAND gate providing the fourth clock signal;

a fourth NOT gate, having an input terminal coupled to the output terminal of the second NAND gate to receive the fourth clock signal, an output terminal of the fourth NOT gate providing the third clock signal;

a fifth NOT gate, having an input terminal receiving the original clock signal;

a third NAND gate, having a first input terminal coupled to an output terminal of the fifth NOT gate, a second input terminal of the third NAND gate being coupled to the output terminal of the third NOT gate, an output terminal of the third NAND gate providing the second clock signal; and a sixth NOT gate, having an input terminal coupled to the output terminal of the third NAND gate to receive the second clock signal, an output terminal of the sixth NOT gate providing the first clock signal.

9. The non-volatile memory device of claim 1, wherein the logic memory circuit comprises:

a first NAND gate, having a first input terminal coupled to a first reset signal;

a first NOT gate, having an input terminal coupled to an output terminal of the first NAND gate;

a first switch, having a first terminal coupled to an output terminal of the first NOT gate, a second terminal of the first switch being coupled to a second input terminal of the first NAND gate, the first switch being controlled by a first clock signal;

a second switch, having a first terminal coupled to the output terminal of the first NAND gate, the second switch being controlled by a second clock signal;

a buffer, having an output terminal coupled to the input terminal of the first NOT gate, the buffer being controlled by a read signal;

a NOR gate, having a first input terminal coupled to a second reset signal, a second input terminal of the NOR gate being coupled to a second terminal of the second switch, wherein the second reset signal is an inversion signal of the first reset signal;

a second NOT gate, having an input terminal coupled to an output terminal of the NOR gate; and a third switch, having a first terminal coupled to an output terminal of the second NOT gate, a second terminal of the third switch being coupled to the second input terminal of the NOR gate and an input terminal of the buffer, the third switch being controlled by a third clock signal, wherein the third clock signal is an inversion signal of the second clock signal.

10. The non-volatile memory device of claim 1, wherein the writing circuit comprises:

a first level shifter, having an input terminal coupled to the output terminal of the logic memory circuit, an output terminal of the first level shifter serving as the second output terminal of the writing circuit, the first level shifter being controlled by a write signal, wherein the output terminal of the first level shifter is disabled when the write signal is in a first logic state, and the output terminal of the first level shifter decides to output a high write voltage or a low write voltage according to a signal at the output terminal of the logic memory circuit when the write signal is in a second logic state, wherein a voltage different between the high write voltage and the low write voltage is greater than a threshold voltage of the non-volatile memory element; and a second level shifter, having an input terminal coupled to a second output terminal of the logic memory circuit, an output terminal of the second level shifter serving as the first output terminal of the writing circuit, the second level shifter being controlled by the write signal, wherein the output terminal of the second level shifter is disabled when the write signal is in the first logic state, and the output terminal of the second level shifter decides to output the high write voltage or the low write voltage according to a signal at the second output terminal of the logic memory circuit when the write signal is in the second logic state.

11. The non-volatile memory device of claim 1, wherein the writing circuit comprises:

a first buffer, having an input terminal coupled to the output terminal of the logic memory circuit, an output terminal of the first buffer serving as the second output terminal of the writing circuit, a power terminal of the first buffer being coupled to a high write voltage, a reference voltage terminal of the first buffer being coupled to a low write voltage, wherein a voltage different between the high write voltage and the low write voltage is greater than a threshold voltage of the non-volatile memory element, and the first buffer is controlled by a write signal to decide whether to disable the output terminal of the first buffer; and a second buffer, having an input terminal coupled to a second output terminal of the logic memory circuit, an output terminal of the second buffer serving as the first output terminal of the writing circuit, a power terminal of the second buffer being coupled to the high write voltage, a reference voltage terminal of the second buffer being coupled to the low write voltage, wherein the second buffer is controlled by the write signal to decide whether to disable the output terminal of the second buffer.

12. The non-volatile memory device of claim 1, wherein the reading circuit comprises:

a first switch, having a first terminal serving as the output terminal of the reading circuit to be coupled to the output terminal of the logic memory circuit, a second terminal of the first switch serving as the first input terminal of the reading circuit to be coupled to the first terminal of the non-volatile memory element, the first switch being controlled by a first read signal, and the first switch is turned off during a normal operation period and the writing period, and the first switch is turned on during the reading period;

a resistor, having a first terminal coupled to the second terminal of the first switch;

a second switch, having a first terminal coupled to a second terminal of the resistor, a second terminal of the second switch being coupled to a system voltage, a control terminal of the second switch being controlled by a second read signal, wherein the second switch is turned off during the normal operation period and the writing period, and the second switch is turned on during the reading period; and a third switch, having a first terminal serving as the second input terminal of the reading circuit to be coupled to the second terminal of the non-volatile memory element, a second terminal of the third switch being coupled to a reference voltage, a control terminal of the third switch being controlled by the first read signal, wherein the third switch is turned off during the normal operation period and the writing period, and the third switch is turned on during the reading period.

13. The non-volatile memory device of claim 1, wherein the reading circuit comprises:

a buffer, having an output terminal serving as the output terminal of the reading circuit to be coupled to the output terminal of the logic memory circuit, an input terminal of the buffer serving as the first input terminal of the reading circuit to be coupled to the first terminal of the non-volatile memory element, the buffer being controlled by a first read signal, wherein the buffer is disabled during a normal operation period and the writing period, and the buffer is enabled during the reading period;

a resistor, having a first terminal coupled to the input terminal of the buffer;

a first switch, having a first terminal coupled to a second terminal of the resistor, a second terminal of the first switch being coupled to a system voltage, a control terminal of the first switch being controlled by a second read signal, wherein the first switch is turned off during the normal operation period and the writing period, and the first switch is turned on during the reading period; and a second switch, having a first terminal serving as the second input terminal of the reading circuit to be coupled to the second terminal of the non-volatile memory element, a second terminal of the second switch being coupled to a reference voltage, a control terminal of the second switch being controlled by the first read signal, wherein the second switch is turned off during the normal operation period and the writing period, and the second switch is turned on during the reading period.

14. An operating method of a non-volatile memory device, comprising:

configuring a logic memory circuit, a non-volatile memory element, a writing circuit and a reading circuit to the non-volatile memory device, wherein an input terminal of the writing circuit is coupled to an output terminal of the logic memory circuit, a first output terminal of the writing circuit being coupled to a first terminal of the non-volatile memory element, a second output terminal of the writing circuit being coupled to a second terminal of the non-volatile memory element, a first input terminal of the reading circuit being coupled to the first terminal of the non-volatile memory element, a second input terminal of the reading circuit being coupled to the second terminal of the non-volatile memory element, an output terminal of the reading circuit being coupled to the output terminal of the logic memory circuit;

writing stored data of the logic memory circuit into the non-volatile memory element by the writing circuit during a writing period; and restoring the data of the non-volatile memory element to the logic memory circuit via the output terminal of the logic memory circuit by the reading circuit during a reading period.

15. The operating method of claim 14, wherein the non-volatile memory element comprises a resistive memory element, wherein a top electrode and a bottom electrode of the resistive memory element serve as the first terminal and the second terminal of the resistive memory element respectively.

16. The operating method of claim 14, further comprising:

disabling the writing circuit and the reading circuit during a normal operation period;

disabling the reading circuit during the writing period;

enabling the writing circuit during the writing period, so as to write the stored data of the logic memory circuit into the non-volatile memory element;

disabling the writing circuit during the reading period; and enabling the reading circuit during the reading period, so as to restore the data of the non-volatile memory element to the logic memory circuit.

* * * * *